US012633738B2

(12) United States Patent
Yoshimura

(10) Patent No.: US 12,633,738 B2
(45) Date of Patent: May 19, 2026

(54) OUTPUT DRIVER

(71) Applicant: Rohm Co., Ltd., Kyoto (JP)

(72) Inventor: Kenichi Yoshimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 231 days.

(21) Appl. No.: 18/634,318

(22) Filed: Apr. 12, 2024

(65) Prior Publication Data

US 2024/0266825 A1 Aug. 8, 2024

Related U.S. Application Data

(63) Continuation of application No. PCT/JP2022/037787, filed on Oct. 11, 2022.

(30) Foreign Application Priority Data

Oct. 15, 2021 (JP) ................................. 2021-169345

(51) Int. Cl.
*H02H 9/04* (2006.01)
*H03K 17/687* (2006.01)

(52) U.S. Cl.
CPC ......... *H02H 9/046* (2013.01); *H03K 17/6871* (2013.01)

(58) Field of Classification Search
CPC ............... H02H 9/046; H03K 17/6871; H03K 19/0175; H10D 84/00; H10D 84/038
USPC .......................................................... 361/56
See application file for complete search history.

(56) References Cited

U.S. PATENT DOCUMENTS

| | | | | |
|---|---|---|---|---|
| 10,224,817 | B1 * | 3/2019 | Sharma ................ | H03K 17/165 |
| 10,536,140 | B1 * | 1/2020 | Ribarich ............ | H03K 17/0822 |
| 11,073,857 | B1 * | 7/2021 | Liberti ........... | H03K 19/018514 |
| 12,489,290 | B2 * | 12/2025 | Lee ........................ | H02H 9/046 |
| 2006/0091915 | A1 * | 5/2006 | Pauletti ............... | H04L 25/0284 |
| | | | | 327/108 |
| 2008/0315936 | A1 * | 12/2008 | Mauthe ............ | H03K 3/356104 |
| | | | | 327/333 |
| 2010/0109743 | A1 * | 5/2010 | Czech .................. | H03K 17/102 |
| | | | | 327/333 |
| 2013/0293278 | A1 * | 11/2013 | Larsen ..................... | H03L 5/00 |
| | | | | 327/333 |

(Continued)

FOREIGN PATENT DOCUMENTS

| | | |
|---|---|---|
| JP | 2003-179226 | 6/2003 |

OTHER PUBLICATIONS

International Search Report and Written Opinion in International Appln. No. PCT/JP2022/037787, mailed on Jan. 10, 2023, 12 pages (with machine translation).

*Primary Examiner* — Dharti H Patel
(74) *Attorney, Agent, or Firm* — Fish & Richardson P.C.

(57) ABSTRACT

An output driver includes a first output signal generator that generates based on a first input signal a first output signal to feed it to the control terminal of a first protection element; a second output signal generator that generates based on a second input signal a second output signal to feed it to the control terminal of a second protection element; and a PN junction structure connected between an output terminal and a power terminal. In normal operation, the first output signal is at low level and the second output signal is at low or high level. When the second input signal is at a floating potential, the first input signal can be at a floating potential regardless of the potential at the power terminal.

8 Claims, 7 Drawing Sheets

(56)    References Cited

U.S. PATENT DOCUMENTS

2020/0153338  A1 *    5/2020  Ribarich  ................. H02M 1/08
2021/0281067  A1 *    9/2021  Chen  .................... H10D 89/815
2021/0313801  A1 *  10/2021  Albertini  ............ H02M 1/0006
2023/0047185  A1 *    2/2023  Anderson  .......... H03K 19/0813

* cited by examiner

OUTPUT DRIVER

CROSS-REFERENCE TO RELATED APPLICATIONS

This nonprovisional application is a continuation application of International Patent Application No. PCT/JP2022/037787 filed on Oct. 11, 2022, which claims priority Japanese Patent Application No. 2021-169345 filed on Oct. 15, 2021, the entire contents of which are hereby incorporated by reference.

TECHNICAL FIELD

The present disclosure relates to an output driver.

BACKGROUND ART

ESD (electro-static discharge) denotes a discharge of static electricity. If, due to an ESD, an ESD pulse enters an IC, a fault may occur in the IC. To avoid this, some conventional ICs include a preventive component to suppress a fault due to an ESD.

Conventionally, a MOS transistor (MOSFET [metal-oxide-semiconductor field-effect transistor]) is known to be used as an ESD protection element (see, for example, Patent Document 1). On occurrence of an ESD, a surge current is passed through a MOS transistor to prevent an adverse effect on an IC.

CITATION LIST

Patent Literature

Patent Document 1: Japanese Patent Application published as No. 2003-179226.

DESCRIPTION OF EMBODIMENTS

Exemplary embodiments of the present disclosure will be described below with reference to the accompanying drawings. An output driver is a circuit configured to output a drive signal externally, and the drive signal is output, for example, to the gate of an external transistor, a CPU, or the like.

1. Layout of an ESD Protection Element

Figure 1A:
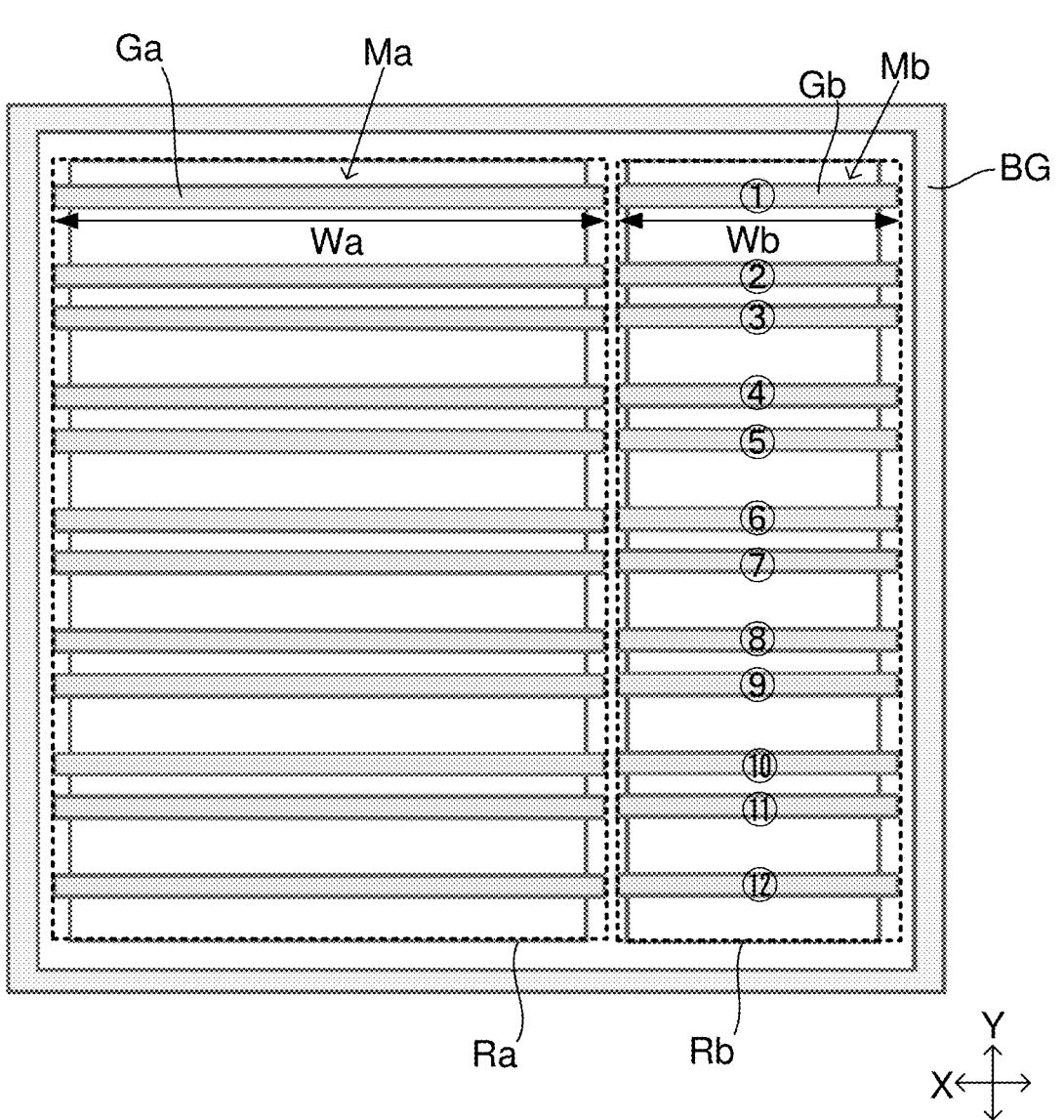
FIG. 1A is a plan view showing one example of the layout of an ESD protection element.

FIG. 1A is a plan view showing one example of the layout of an ESD protection element. FIG. 1A illustrates the configuration of a principal portion of an output driver IC according to the present disclosure. The configuration shown in FIG. 1A is arranged at a position in the output driver IC electrically close to outside the IC. In FIG. 1A, X direction and Y direction are indicated that are perpendicular to each other.

As shown in FIG. 1A, the output driver IC has, as regions where the protection element is arranged, a protection-dedicated element region Ra and a protection element selection region Rb.

In the protection-dedicated element region Ra, a protection element Ma that functions only as an ESD protection element is arranged. The protection element Ma is configured as an NMOS transistor (n-channel MOSFET). As shown in FIG. 1A, a plurality of protection elements Ma are arrayed in Y direction. In FIG. 1A, as one example, 12 protection elements Ma are arrayed. As shown in FIG. 1A, the protection element Ma has a gate Ga with a gate width Wa in X direction and a gate length in Y direction.

The protection element selection region Rb is adjacent to the protection-dedicated element region Ra in X direction. In the protection element selection region Rb, a protection element Mb that performs ESD protection is arranged. The protection element Mb is configured as an NMOS transistor. As shown in FIG. 1A, a plurality of protection elements Mb are arrayed in Y direction. In FIG. 1A, as one example, 12 protection elements Mb are arrayed (number 1 to 12). As shown in FIG. 1A, the protection element Mb has a gate Gb with a gate width Wb in X direction and a gate length in Y direction.

The plurality of protection elements Ma are connected in parallel with each other and are arranged at a position electrically closer to the outside than the protection elements Mb. In this way, it is possible, on occurrence of an ESD, to pass a surge current through the protection elements Ma to suppress its influence on inside the IC. In addition, by making the gate width Wa of the protection element Ma greater than the gate width Wb of the protection element Mb, it is possible to direct a high surge current to the protection element Ma at a position closer to the outside.

In the protection element selection region Rb, it is possible to select, out of the plurality of protection elements Mb, protection elements Mb (driver-cum-protection elements) that have both an ESD protection function and a driver element function and protection elements Mb (protection-dedicated elements) that only have the ESD protection function. The selection is performed by changing the wirings to the gates Gb (by selecting the signal to be fed to the gates Gb).

In the example in FIG. 1A, out of the 12 protection elements Mb, for example, one protection element Mb can be selected as a driver-cum-protection element, and the remaining 11 protection elements Mb can be selected as protection-dedicated elements. Or, for example, all the 12 protection elements Mb can be selected as driver-cum-protection elements. The number of driver-cum-protection elements is selected according to the current capacity needed. When an ESD occurs, a surge current passes through both the driver-cum-protection elements and the protection-dedicated elements, and it activates a function of protecting inside the IC.

Figure 1B:
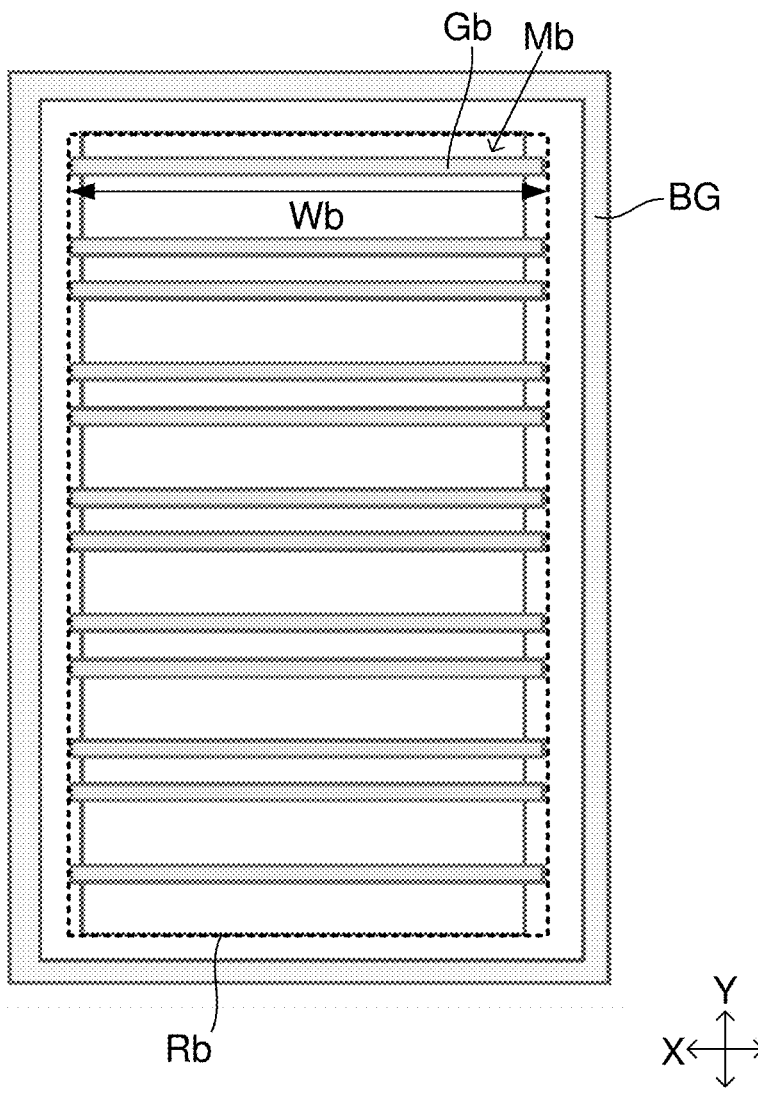
FIG. 1B is a plan view showing another example of the layout of an ESD protection element.

As shown in FIG. 1B, the IC may have no protection-dedicated element region Ra (protection element Ma) and only have a protection element selection region Rb (protection element Mb).

2. Comparative Example

Figure 2:
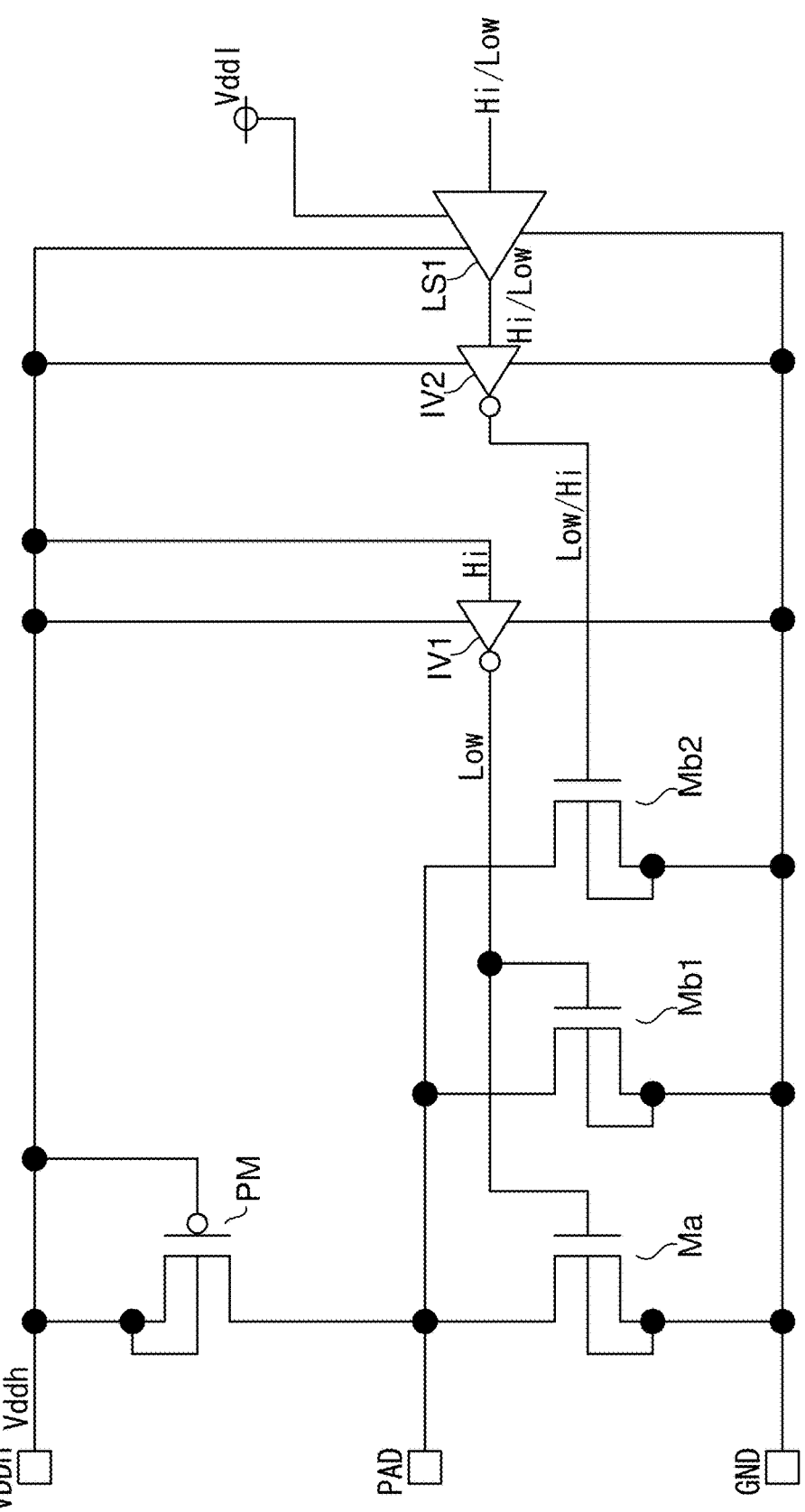
FIG. 2 is a diagram showing the configuration of some circuits included in an output driver IC according to a comparative example (in normal operation)
Figure 3:
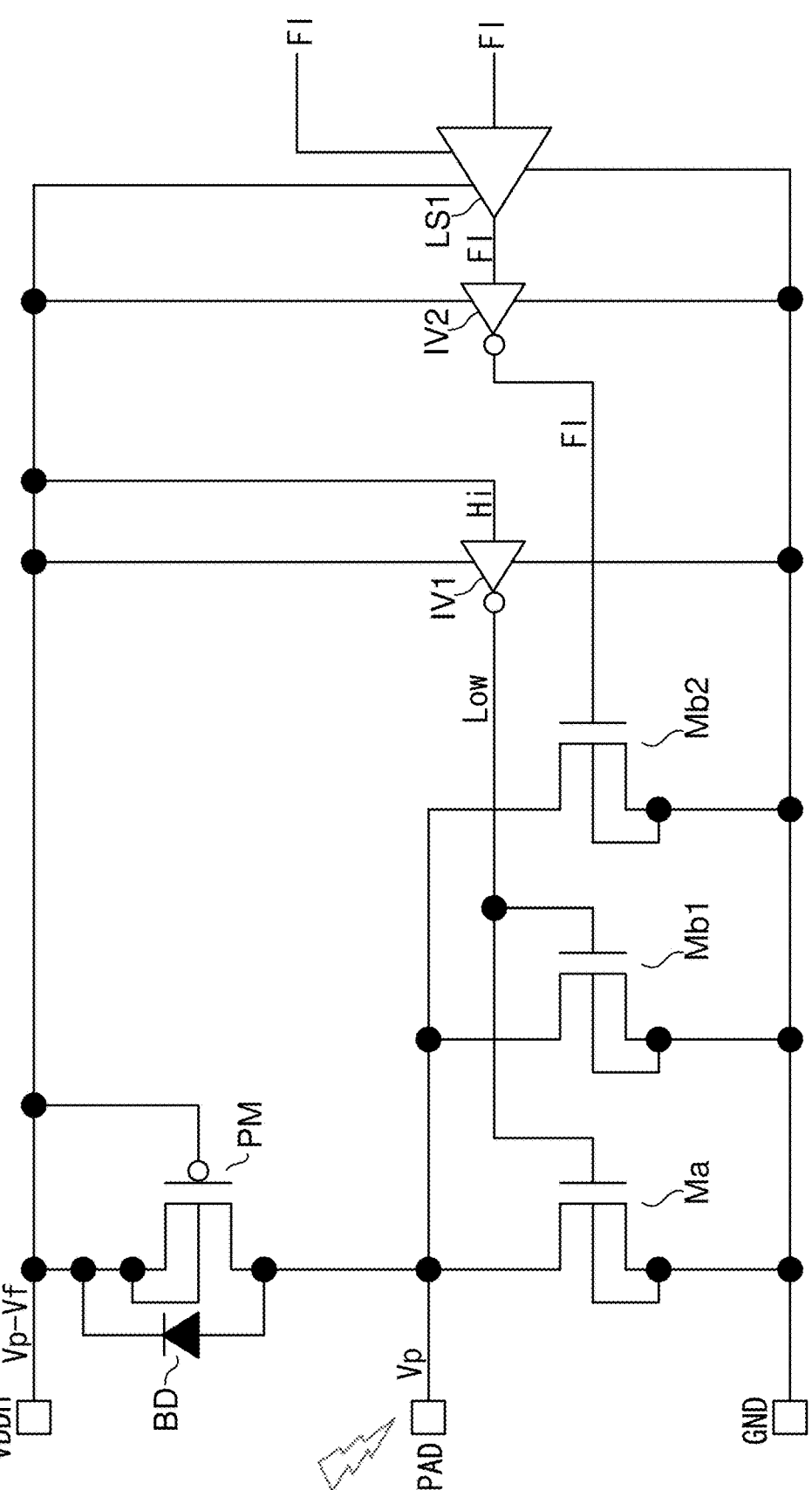
FIG. 3 is a diagram showing the configuration of some circuits included in the output driver IC according to the comparative example (on occurrence of an ESD)

Now, a comparative example to be compared with an embodiment of the present disclosure will be described. FIGS. 2 and 3 are diagrams showing the configuration of some circuits included in an output driver IC according to the comparative example. FIGS. 2 and 3 illustrate the same circuit in different operating conditions as will be described later.

As shown in FIG. 2, the output driver IC according to the comparative example includes a protection element Ma, a protection element Mb1, a protection element Mb2, a protection element PM, an inverter IV1, an inverter IV2, and a level shifter LS1. The output driver IC has, as an external terminal for establishing electrical connection with the outside, a power terminal VDDH, an output terminal PAD, and a ground terminal GND.

The protection elements Ma, Mb1, and Mb2 are, as described earlier, all configured as NMOS transistors. FIG. 2 and other diagrams assume, for the sake of convenience, that there are one of each of the protection element Ma as a protection-dedicated element, the protection element Mb1 that is a protection element Mb (FIG. 1) selected as a protection-dedicated element, and the protection element Mb2 which is a protection element Mb (FIG. 1) selected as a driver-cum-protection element.

The drains of the protection elements Ma, Mb1, and Mb2 are connected to the output terminal PAD, and their sources are connected to the ground terminal GND. The gates of the protection elements Ma and Mb1, which are both protection-dedicated elements, are connected to the output terminal of the inverter IV1. That is, the output signal of the inverter IV1 can be fed to the gates of the protection elements Ma and Mb1. The input terminal of the inverter IV1 is connected to the power terminal VDDH. This allows a first supply voltage Vddh applied to the power terminal VDDH to be fed to the inverter IV1. The first supply voltage Vddh serves as a power source for the inverter IV1.

On the other hand, the gate of the protection element Mb2, which is a driver-cum-protection element, is connected to the output terminal of the inverter IV2. That is, the output signal of the inverter IV2 can be fed to the gate of the protection element Mb2. The input terminal of the inverter IV2 is connected to the output terminal of the level shifter LS1. The level shifter is a circuit that shifts the logic level of the input signal to output the result to the inverter IV2. The first supply voltage Vddh serves as a power source for the inverter IV2 and the level shifter LS1. The level shifter LS1 is fed also with a second supply voltage Vddl as a power source. The second supply voltage Vddl is a voltage lower than the first supply voltage Vddh, and is applied from outside the IC or is generated inside the IC.

The protection element PM is configured as a PMOS transistor (p-channel MOSFET) and has a function of ESD protection. The drain of the protection element PM is connected to the output terminal PAD, and its source is connected to the power terminal VDDH. The gate and the source of the protection element PM is short-circuited to each other. Or, the gate and the source of the protection element PM may be kept at the same potential through a circuit. Like the protection elements Mb1 and Mb2, a plurality of protection elements PM may be provided, and one or more of them may be used as a driver.

Next, the normal operation of the circuit shown in FIG. 2 will be described. In normal operation, as shown in FIG. 2, the first supply voltage Vddh is applied to the power terminal VDDH and thus the input signal to the inverter IV1 is at high level. The output signal of the inverter IV1, at low level as a result of level inversion, is fed to the gates of the protection elements Ma and Mb1. In this way, in normal operation, the protection elements Ma and Mb1 are both off.

On the other hand, in normal operation, the signal fed to the level shifter LS1 is at high or low level, and has its level shifted by the level shifter LS1 so as to be output as a high-or low-level output signal. The output signal of the inverter IV2 is, as a result of level inversion on the signal fed from the level shifter LS1, at low or high level. When the output signal of the inverter IV2 is at low level, the protection element Mb2 is off, and, when the output signal of the inverter IV2 is at high level, the protection element Mb2 is on. A drive signal is output from the output terminal PAD with a level corresponding to the on/off state of the protection element Mb2.

By contrast, in the circuit shown in FIG. 2, an ESD can occur in different modes. Note that an ESD occurs with no first supply voltage Vddh fed to the power terminal VDDH.

For example, in a mode where an ESD pulse is fed to the ground terminal GND and a ground potential is applied to the output terminal PAD, ESD protection is performed by passing a surge current through the body diodes (parasitic diodes) (not shown in FIG. 2) of the protection elements Ma, Mb1, and Mb2. In a mode where an ESD pulse is fed to the output terminal PAD and the ground potential is applied to the power terminal VDDH, ESD protection is performed by passing a surge current through the body diode (not shown in FIG. 2) of the protection element PM. In a mode where an ESD pulse is fed to the VDDH terminal and the ground potential is applied to the output terminal PAD, ESD protection is performed by passing a surge current through the parasitic bipolar transistor of the protection element PM. Or, ESD protection is performed by passing a surge current through a protection element separately provided between the VDDH terminal and the GND terminal and through the protection elements Ma, Mb1, and Mb2.

Here, the mode where an ESD pulse is fed to the output terminal PAD and the ground potential is applied to the ground terminal GND will be described with reference to FIG. 3.

In the above-mentioned mode, as shown in FIG. 3, a high voltage Vp applied to the output terminal PAD and the body diode BD of the protection element PM produce a voltage equal to Vp–Vf (where Vf is the forward voltage of the body diode BD) at the power terminal VDDH. Thus, as shown in FIG. 3, the input signal to the inverter IV1 equals Vp–Vf, that is, almost at high level, and, as a result of its logic level being inverted with the inverter IV1, a low-level signal is applied to the gates of the protection elements Ma and Mb1.

By contrast, on occurrence of an ESD, the signal fed to the level shifter LS1 and the signal that appears on a line for supplying the second supply voltage Vddl to the level shifter LS1 are both at a floating potential (indefinite potential). Thus, the output signal of the level shifter LS1 and the output signal of the inverter IV2 are both at a floating potential. Thus, the gate of the protection element Mb2 is at a floating potential.

Figure 4:
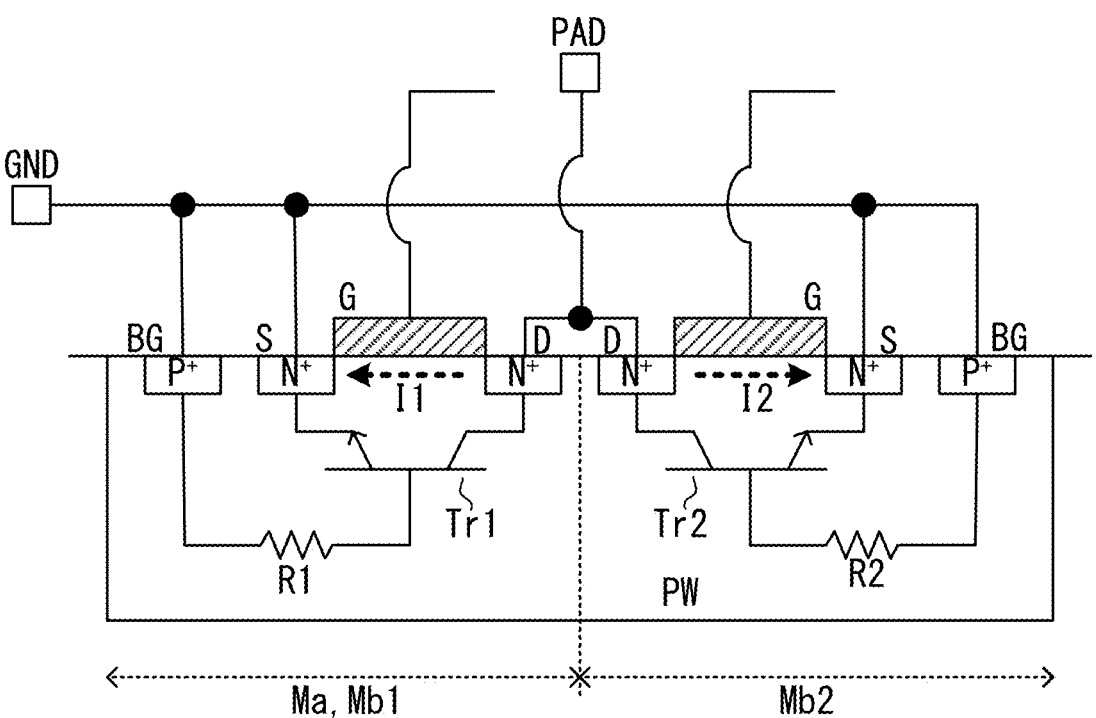
FIG. 4 is a diagram showing one example of the vertical structure of the protection element.

FIG. 4 is a diagram showing the vertical structure of the protection element Ma, Mb1 and the protection element Mb2. The protection element Ma, Mb1 and the protection element Mb2 are formed in a P-well region PW in an N-type substrate.

As shown in FIG. 4, in each of the protection element Ma, Mb1 and the protection element Mb2, the NPN junctions between a drain D in an N+ region and the P-well region PW and a source S in an N+ region form a parasitic bipolar transistor Tr1 or Tr2. In each of the protection elements Ma and Mb1 and the protection element Mb2, a back gate BG in a P+ region is connected to the ground terminal GND. As shown in FIG. 1A, the back gate BG is formed as an annular region surrounding from outside the protection-dedicated element region Ra and the protection element selection region Rb. With this structure, given the operating principle of a parasitic bipolar transistor, if one of the MOS transistors surrounded by the back gate operates as a protection element, all the MOS transistors surrounded by that back gate are expected to operate as protection elements.

As shown in FIG. 3, when a low-level signal is applied to the gate G of the protection element Ma, Mb1, no channel current I1 appears that flows through a channel right under the gate G of the protection element Ma, Mb1. On the other hand, since a high voltage Vp is applied to the drain D of the protection element Ma, Mb1, a leakage current occurs at the PN junction (reverse-biased diode) between the drain D and the P-well region PW. The leakage current flows via a resistance component R1 of the P-well region PW to the back gate BG and in addition acts as the base current of the parasitic bipolar transistor Tr1; thus, an emitter current flows to turn on parasitic bipolar transistor Tr1. Thus, a surge current is directed from the source S to the ground terminal GND (ground potential).

However, as shown in FIG. 3, when a low-level signal is applied to the gate G of the protection element Ma, Mb1 and, at the same time, a floating potential is applied to the gate of the protection element Mb2, a channel current I2 is more likely to flow through a channel right under the gate G of the protection element Mb2; thus, it is highly likely that the channel current I2 flows first and subsequently a current flows through the parasitic bipolar transistor Tr1 in the protection element Ma, Mb1. This makes it more likely that a surge current flows through the protection element Mb2 in a concentrated manner, which functions also as a driver, and this may adversely affect the protection element Mb2.

3. A Circuit Configuration According to the Present Disclosure

To solve the above-mentioned problem with the comparative example, according to an embodiment of the present disclosure, a circuit configuration as described below is employed.

Figure 5:
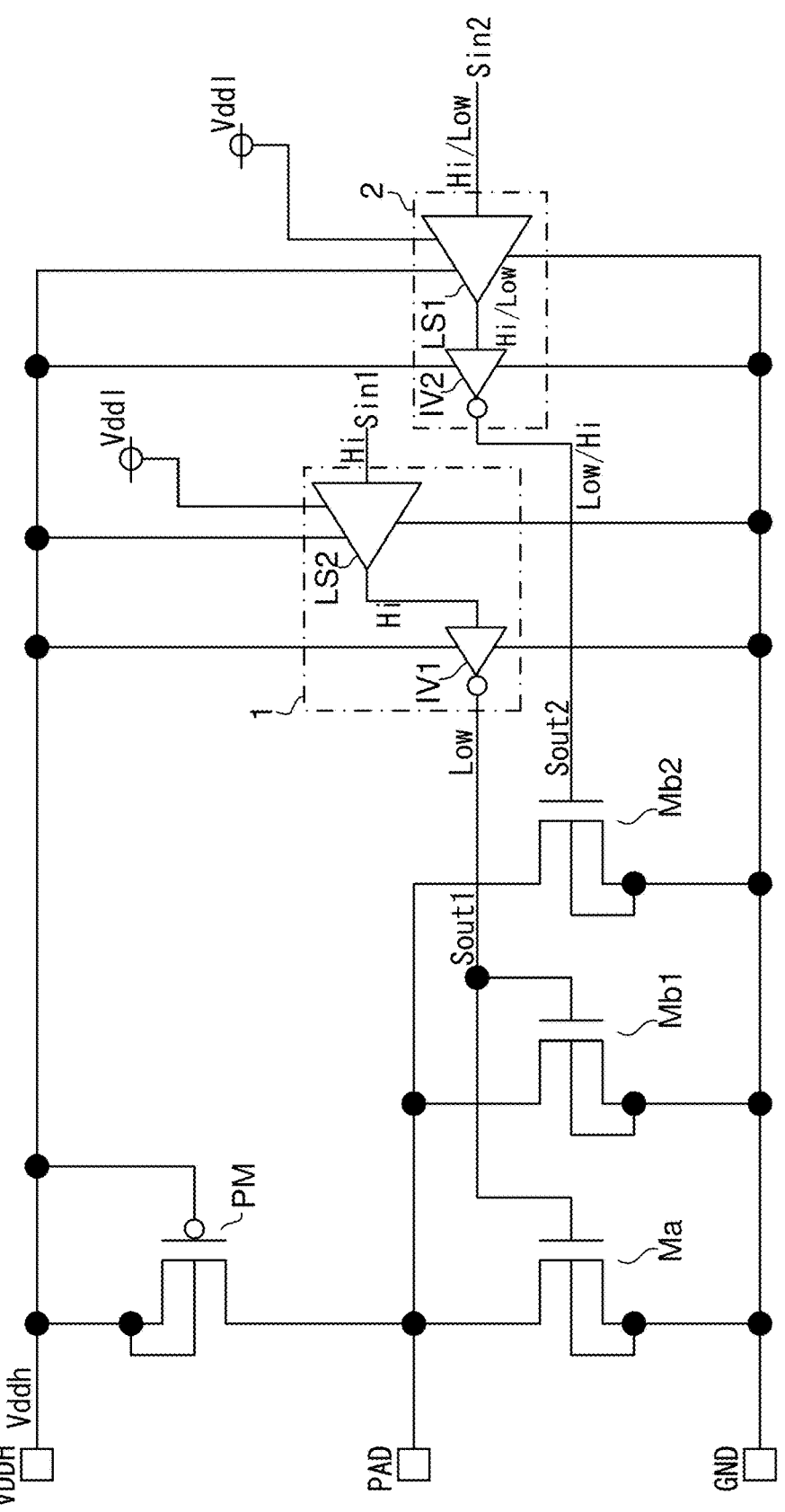
FIG. 5 is a diagram showing the configuration of some circuits included in an output driver IC according to an embodiment of the present disclosure (in normal operation).
Figure 6:
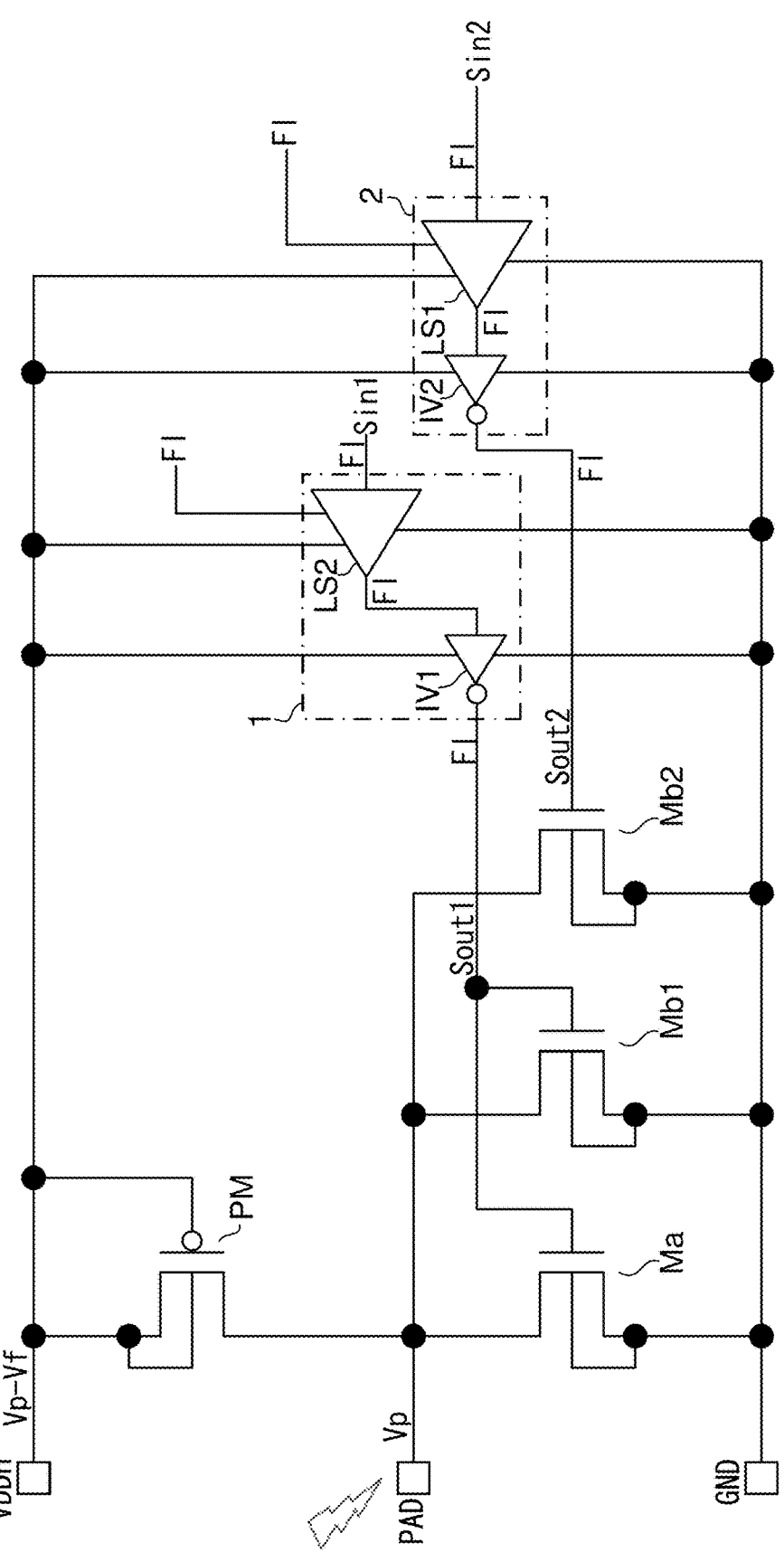
FIG. 6 is a diagram showing the configuration of some circuits included in the output driver IC according to the embodiment of the present disclosure (on occurrence of an ESD).

FIGS. 5 and 6 are diagrams showing the configuration of some circuits included in an output driver IC according to an embodiment of the present disclosure. FIGS. 5 and 6 illustrate the same circuit in different operating conditions.

The difference from the comparative example (FIG. 2) with the circuit configuration shown in FIG. 5 is the additional provision of a level shifter LS2. The output driver IC according to the embodiment includes a first output signal generator 1. The first output signal generator 1 includes a level shifter LS2 and an inverter IV1. The input terminal of the inverter IV1 is connected to the output terminal of the level shifter LS2. This allows the output signal of the level shifter LS2 to be fed to the input terminal of the inverter IV1. The level shifter LS2 shifts the level of a first input signal Sin1 fed to it to output the result to the inverter IV1. To the level shifter LS2, a first supply voltage Vddh is supplied as a power source and also a second supply voltage Vddl is fed as a power source. The first input signal Sin1 has its level shifted by the level shifter LS2 and has its level inverted by the inverter IV1 to be output as a first output signal Sout1. The first output signal Sout1 is applied to the gates of the protection elements Ma and Mb1.

As shown in FIG. 5, the output driver IC according to the embodiment includes a second output signal generator 2. The second output signal generator 2 includes a level shifter LS1 and an inverter IV2. A second input signal Sin2 has its level shifted by the level shifter LS1 and has its level inverted by the inverter IV2 to be output as a second output signal Sout2. The second output signal Sout2 is applied to the gate of the protection elements Mb2. Note that also the output driver IC (FIG. 2) according to the comparative example includes a second output signal generator.

With this configuration, in normal operation, as shown in FIG. 5, the first supply voltage Vddh is applied to the power terminal VDDH and the second supply voltage Vddl appears. The first input signal Sin1 fed to the level shifter LS2 is at high level and has its level shifted by the level shifter LS2 to be output as a high-level output signal. The first output signal Sout1 is at low level as a result of the signal input from the level shifter LS2 having its level inverted by the inverter IV1. Thus, a low-level signal is applied to the gates of the protection elements Ma and Mb1, and the protection elements Ma and Mb1 are both off.

As shown in FIG. 5, in normal operation, the second input signal Sin2 is at high or low level, and thus the second output signal Sout2 is at low or high level. Thus, the protection element Mb2, which functions also as a driver, is off or on.

By contrast, as shown in FIG. 6, in a mode where, on occurrence of an ESD, a high voltage Vp is applied to the output terminal PAD and the ground potential is applied to the ground terminal GND, even if a voltage equal to Vp−Vf appears at the power terminal VDDH as described above, the first input signal Sin1 fed to the level shifter LS2 and a signal that appears on a line through which the second supply voltage Vddl is fed to the level shifter LS2 are at a floating potential; thus, the signal output from the level shifter LS2 and the first output signal Sout1 output from the inverter IV1 are at a floating potential. Thus, the gates of the protection elements Ma and Mb1 are fed with, instead of a low-level signal as in the comparative example (FIG. 3), a floating potential.

As in comparative example, as shown in FIG. 6, the second input signal Sin2 and the signal that appears on the line through which the second power supply voltage Vddl is fed to the level shifter LS1 are both at a floating potential; thus, the second output signal Sout2 is at a floating potential. Thus, the gates of the protection elements Ma and Mb1 and the gate of the protection element Mb2 are both fed with a floating potential.

In this state, due to a high voltage Vp applied to the output terminal PAD, there is a possibility that a channel current I1 passes through the channel of the protection elements Ma and Mb1 and simultaneously a channel current I2 passes through the channel of the protection element Mb2.

There is also a possibility that the parasitic bipolar transistors Tr1 in the protection elements Ma and Mb1 and the parasitic bipolar transistor Tr2 (FIG. 4) in the protection element Mb2 both turn on simultaneously, with the result that currents pass through the parasitic bipolar transistors Tr1 and Tr2 simultaneously. As in the parasitic bipolar transistor Tr1 described earlier, also in the protection element Mb2, a leakage current flowing from the drain to the P-well region PW flows via a resistance component R2 of the P-well region PW to the back gate BG and in addition acts as the base current of the parasitic bipolar transistor Tr2 to turn on the parasitic bipolar transistor Tr2.

There is also a possibility that first a channel current I1 flows in the protection elements Ma and Mb1 and subsequently a current flows through the parasitic bipolar transistor Tr2 in the protection element Mb2.

Thus, in the embodiment, owing to a floating potential being applied to both the gates of the protection elements Ma and Mb1 and the gate of the protection element Mb2, it is possible to reduce the possibility that first a channel current I2 flows through the channel of the protection element Mb2 and subsequently a current flows through the parasitic bipolar transistor Tr1 in the protection elements Ma and Mb1. Thus, it is possible to prevent a surge current from flowing through the protection element Mb2 in a concentrated manner, which functions also as a driver, and adversely affecting the protection element Mb2.

4. Others

The embodiments of the present invention described above allow for many modifications made without departing from the spirit of the present invention.

5. Notes

According to one aspect of the present disclosure, an output driver includes a first protection element (Ma, Mb1) having a first terminal connected to an output terminal (PAD) and a second terminal connected to a ground terminal (GND); a second protection element (Mb2) having a first terminal connected to the output terminal and a second terminal connected to the ground terminal; a first output signal generator (1) that generates based on a first input signal (Sin1) a first output signal (Sout1) to feed it to the control terminal of the first protection element; a second output signal generator (2) that generates based on a second input signal (Sin2) a second output signal (Sout2) to feed it to the control terminal of the second protection element; and a PN junction structure (BD) connected between the output terminal and a power terminal (VDDH). In normal operation, the first output signal is at low level and the second output signal is at low or high level. When the second input signal is at a floating potential, the first input signal can be at a floating potential regardless of the potential at the power terminal. (A first configuration.)

In the first configuration described above, preferably, the first and second protection elements are both configured as NMOS transistors. (A second configuration.)

In the second configuration described above, preferably, one or more elements (Ma) in the first protection element are arranged in a first region (Ra), and other one or more elements (Mb1) in the first protection element and the second protection element (Mb2) are arranged in a second region (Rb) adjacent to the first region. (A third configuration.)

In the third configuration described above, preferably, the elements arranged in the first region are arranged at a position electrically closer to outside the output driver than the elements arranged in the second region, and the gate width (Wa) of the elements arranged in the first region is greater than the gate width (Wb) of the elements arranged in the second region. (A fourth configuration.)

In the third or fourth configuration described above, preferably, the back gate (BG) of the first and second protection elements is formed as an annular region surrounding the first and second regions from outside. (A fifth configuration.)

In any of the first to fifth configurations described above, preferably, the output driver further includes a third protection element (PM) configured as a PMOS transistor, and the PN junction structure is a body diode (BD) included in the third protection element. (A sixth configuration.)

In any of the first to sixth configurations described above, preferably, the first output signal generator (1) includes a first level shifter (LS2) fed with the first input signal (Sin1) and fed with the voltage at the power terminal (VDDH) and a first inverter (IV1) fed with a signal output from the first level shifter to output the first output signal (Sout1). (A seventh configuration.)

In any of the first to seventh configurations described above, preferably, the second output signal generator (2) includes a second level shifter (LS1) fed with the second input signal (Sin2) and a second inverter (IV2) fed with a signal output from the second level shifter to output the second output signal (Sout2). (An eighth configuration.)

INDUSTRIAL APPLICABILITY

The present disclosure finds application in, for example, output drivers that output drive signals to the gate and the like.

REFERENCE SIGNS LIST 1 first output signal generator
2 second output signal generator
BD body diode
BG back gate
D drain
G gate
GND ground terminal
Ga, Gb gate
IV1, IV2 inverter
LS1, LS2 level shifter
Ma, Mb, Mb1, Mb2 protection element
PAD output terminal
PM protection element
PW P-well region
R1, R2 resistance component
Ra protection-dedicated element region
Rb protection element selection region
S source
Tr1, Tr2 parasitic bipolar transistor
VDDH power terminal

The invention claimed is:

1. An output driver comprising:
a first protection element having a first terminal connected to an output terminal and a second terminal connected to a ground terminal;
a second protection element having a first terminal connected to the output terminal and a second terminal connected to the ground terminal;
a first output signal generator that generates a first output signal based on a first input signal to feed the first output signal to a control terminal of the first protection element;
a second output signal generator that generates a second output signal based on a second input signal to feed the second output signal to a control terminal of the second protection element; and a PN junction structure connected between the output terminal and a power terminal, wherein, in normal operation, the first output signal is at low level and the second output signal is at low or high level, and when the second input signal is at a floating potential, the first input signal can be at a floating potential regardless of a potential at the power terminal.

2. The output driver according to claim 1, wherein the first and second protection elements are both configured as NMOS transistors.

3. The output driver according to claim 2, wherein one or more elements in the first protection element are arranged in a first region, and other one or more elements in the first protection element and the second protection element are arranged in a second region adjacent to the first region.

4. The output driver according to claim 3, wherein the elements arranged in the first region are arranged at a position electrically closer to outside the output driver than the elements arranged in the second region, and a gate width of the elements arranged in the first region is greater than a gate width of the elements arranged in the second region.

5. The output driver according to claim 3, wherein a back gate of the first and second protection elements is formed as an annular region surrounding the first and second regions from outside.

6. The output driver according to claim 1, further comprising a third protection element configured as a PMOS transistor, wherein the PN junction structure is a body diode included in the third protection element.

7. The output driver according to claim 1, wherein the first output signal generator includes a first level shifter fed with the first input signal and fed with a voltage at the power terminal and a first inverter fed with a signal output from the first level shifter to output the first output signal.

8. The output driver according to claim 1, wherein the second output signal generator includes a second level shifter fed with the second input signal and a second inverter fed with a signal output from the second level shifter to output the second output signal.

\* \* \* \* \*